United States Patent
Jeong et al.

(10) Patent No.: US 9,312,787 B2
(45) Date of Patent: Apr. 12, 2016

(54) INVERTER WITH SERIES CONNECTED GATE DRIVING CIRCUITS AND VOLTAGE DIVIDER

(71) Applicant: SAMSUNG ELECTRO-MECHANICS CO., LTD., Suwon, Gyunggi-do (KR)

(72) Inventors: In Wha Jeong, Gyunggi-do (KR); Bum Seok Suh, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 568 days.

(21) Appl. No.: 13/770,882

(22) Filed: Feb. 19, 2013

(65) Prior Publication Data

US 2014/0084693 A1 Mar. 27, 2014

(30) Foreign Application Priority Data

Sep. 27, 2012 (KR) .......................... 10-2012-0107730

(51) Int. Cl.
*H02M 1/08* (2006.01)
*H02M 7/537* (2006.01)
(Continued)

(52) U.S. Cl.
CPC ............... *H02M 7/537* (2013.01); *H02M 7/538* (2013.01); *H03K 17/102* (2013.01); *H02M 1/08* (2013.01); *H03K 2217/0063* (2013.01); *H03K 2217/0081* (2013.01); *Y10T 307/685* (2015.04)

(58) Field of Classification Search
CPC .......... H02M 2001/0006; H02M 1/08; H02M 1/088; H02M 1/096; H02M 7/53; H02M 7/53846
See application file for complete search history.

(56) References Cited

U.S. PATENT DOCUMENTS 4,791,345 A * 12/1988 Boillat ...................... H02P 8/24
318/685
5,212,630 A * 5/1993 Yamamoto ............ H02M 7/493
363/65

(Continued)

FOREIGN PATENT DOCUMENTS

CN    102069842 A    5/2011
JP    2000-010523 A    1/2000

(Continued)

OTHER PUBLICATIONS

Office Action issued on Feb. 18, 2014 in the corresponding Japanese Patent Application No. 2013-027882.

(Continued)

*Primary Examiner* — Harry Behm
*Assistant Examiner* — Peter Novak
(74) *Attorney, Agent, or Firm* — McDermott Will & Emery LLP

(57) ABSTRACT

An inverter includes an inverter unit including at least one inverter arm having at least one high side switch and at least one low side switch connected to each other in series between a ground and an input power terminal providing input power having a preset voltage level, and switching the input power to output AC power; and a high voltage gate driving circuit unit including at least one high voltage gate driving unit having a plurality of high voltage gate drivers connected in series between an input terminal of an instruction signal requesting a switching control of the inverter unit and an output terminal of a control signal controlling switching of the inverter unit, such that switching of the high side switch is controlled, and voltage generated at the time of switching the high side switch is divided and applied to the plurality of high voltage gate drivers.

24 Claims, 9 Drawing Sheets

(51) Int. Cl.
*H02M 7/538* (2007.01)
*H03K 17/10* (2006.01)

(56) References Cited

U.S. PATENT DOCUMENTS

| | | | | |
|---|---|---|---|---|
| 5,847,536 | A * | 12/1998 | Miyazaki | H02P 25/04 318/801 |
| 6,404,655 | B1 * | 6/2002 | Welches | H02M 7/53875 363/17 |
| 8,451,045 | B2 * | 5/2013 | Yim | H02M 1/08 327/392 |
| 8,525,451 | B2 | 9/2013 | Kitamoto | |
| 2002/0110008 | A1 | 8/2002 | Miyazaki et al. | |
| 2004/0120170 | A1 * | 6/2004 | Scott | H02M 1/08 363/97 |
| 2009/0180228 | A1 | 7/2009 | Iwagami et al. | |

FOREIGN PATENT DOCUMENTS

| | | |
|---|---|---|
| JP | 2007-236134 A | 9/2007 |
| KR | 10-2005-0052339 | 6/2005 |
| KR | 10-2011-0096713 | 8/2011 |

OTHER PUBLICATIONS

Chinese Notification of the First Office Action issued in corresponding Chinese Patent Application No. 2013100660149, mailed on Jul. 10, 2015; with English translation.

* cited by examiner

INVERTER WITH SERIES CONNECTED GATE DRIVING CIRCUITS AND VOLTAGE DIVIDER

CROSS-REFERENCE TO RELATED APPLICATIONS

This application claims the priority of Korean Patent Application No. 10-2012-0107730 filed on Sep. 27, 2012, in the Korean Intellectual Property Office, the disclosure of which is incorporated herein by reference.

BACKGROUND OF THE INVENTION

1. Field of the Invention

The present invention relates to a gate driving circuit driven when a high voltage is applied thereto and an inverter having the same.

2. Description of the Related Art

Generally, an inverter, a circuit receiving direct current (DC) power and outputting alternating current (AC) power, may control voltage magnitude, a frequency, or the like, of the AC power, to output the AC power or drive a motor.

The above-mentioned inverter may be widely used domestically, commercially, industrially or the like.

In order to drive the above-mentioned inverter, a driving apparatus may be employed, wherein the driving apparatus may drive the inverter so that a switch of an arm for providing the AC power in the inverter is turned on or turned off to provide the AC power.

Meanwhile, the inverter may be used commercially and industrially, as well as domestically, wherein high voltage AC power may be necessary due to characteristics of industrial inverters.

A general inverter may employ gate driving integrated circuits controlling turning on and turning off of each of a high side switch and a low side switch of an inverter arm, wherein the gate driving integrated circuit controlling the turning on and turning off of the high side switch should have withstand-voltage characteristics capable of withstanding a high voltage level due to the high voltage applied to the high side switch.

However, in the case of the industrial inverter, a high voltage of 1200V or more may be applied to the high side switch and the withstand-voltage characteristics of the high voltage gate driving integrated circuit controlling the driving of the high side switch need to withstand the voltage level of 1200V or more, but the high voltage gate driving integrated circuit having the above-mentioned withstand-voltage characteristics has relatively high manufacturing costs.

RELATED ART DOCUMENT (Patent Document 1) Korean Patent Laid-Open Publication No. 10-2005-0052339

SUMMARY OF THE INVENTION

An aspect of the present invention provides a gate driving circuit operating stably when a high voltage is applied thereto and having low manufacturing costs and an inverter having the same.

According to an aspect of the present invention, there is provided a gate driving circuit, including: a high voltage gate driving circuit unit including at least one high voltage gate driving unit having a plurality of high voltage gate drivers connected to each other in series between an input terminal of an instruction signal requesting a switching control of an inverter unit and an output terminal of a control signal controlling switching of the inverter unit, the inverter unit including at least one inverter arm having at least two switches and switching input power to output alternating current (AC) power, and the high voltage gate driving circuit unit controlling switching of a high side switch of the at least two switches, dividing voltage generated at the time of the switching of the high side switch, and applying the divided voltage to the plurality of high voltage gate drivers.

The high voltage gate driving circuit unit may include a voltage-dividing unit dividing the voltage generated at the time of the switching of the high side switch and applied to the plurality of high voltage gate drivers, respectively.

The voltage-dividing unit may include a plurality of balancers connected to the plurality of high voltage gate drivers in parallel, respectively, and equally dividing the voltage applied to the plurality of high voltage gate drivers, respectively.

At least one balancer among the plurality of balancers may include at least one resistor connected to a corresponding high voltage gate driver in parallel.

The at least one balancer among the plurality of balancers may further include at least one diode connected to the at least one resistor in parallel.

The inverter unit may be supplied with a single driving power.

The at least one high voltage gate driving unit may further include a power supplying unit having a plurality of power suppliers transferring the single driving power to the plurality of high voltage gate drivers, respectively.

The plurality of power suppliers may include at least one or more diodes connected to each other in series.

The plurality of power suppliers may include at least one or more diodes connected to each other in parallel.

The gate driving circuit may further include a low voltage gate driving unit controlling switching of a low side switch of the at least two switches.

The inverter unit may include three inverter arms connected to each other in parallel.

The gate driving circuit may further include first to third high voltage gate driving circuit units driving respective high side switches of the three inverter arms.

According to another aspect of the present invention, there is provided an inverter, including: an inverter unit including at least one inverter arm having at least one high side switch and at least one low side switch connected to each other in series between a ground and an input power terminal providing input power having a preset voltage level, and switching the input power to output AC power; and a high voltage gate driving circuit unit including at least one high voltage gate driving unit having a plurality of high voltage gate drivers connected in series between an input terminal of an instruction signal requesting a switching control of the inverter unit and an output terminal of a control signal controlling switching of the inverter unit, such that switching of the at least one high side switch is controlled, and voltage generated at the time of the switching of the at least one high side switch is divided and applied to the plurality of high voltage gate drivers.

The high voltage gate driving circuit unit may include a voltage-dividing unit dividing the voltage generated at the time of the switching of the at least one high side switch and applied to the plurality of high voltage gate drivers, respectively.

The voltage-dividing unit may include a plurality of balancers connected to the plurality of high voltage gate drivers in parallel, respectively, and equally dividing the voltage applied to the plurality of high voltage gate drivers, respectively.

At least one balancer among the plurality of balancers may include at least one resistor connected to a corresponding high voltage gate driver in parallel.

The at least one balancer among the plurality of balancers may further include at least one diode connected to the at least one resistor in parallel.

The inverter unit may be supplied with a single driving power.

The at least one high voltage gate driving unit may further include a power supplying unit having a plurality of power suppliers transferring the single driving power to the plurality of high voltage gate drivers, respectively.

The plurality of power suppliers may include at least one or more diodes connected to each other in series.

The plurality of power suppliers may include at least one or more diodes connected to each other in parallel.

The inverter may further include a low voltage gate driving unit controlling switching of the at least one low side switch.

The inverter unit may include three inverter arms connected to each other in parallel.

The inverter may further include first to third high voltage gate driving circuit units driving respective high side switches of the three inverter arms.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
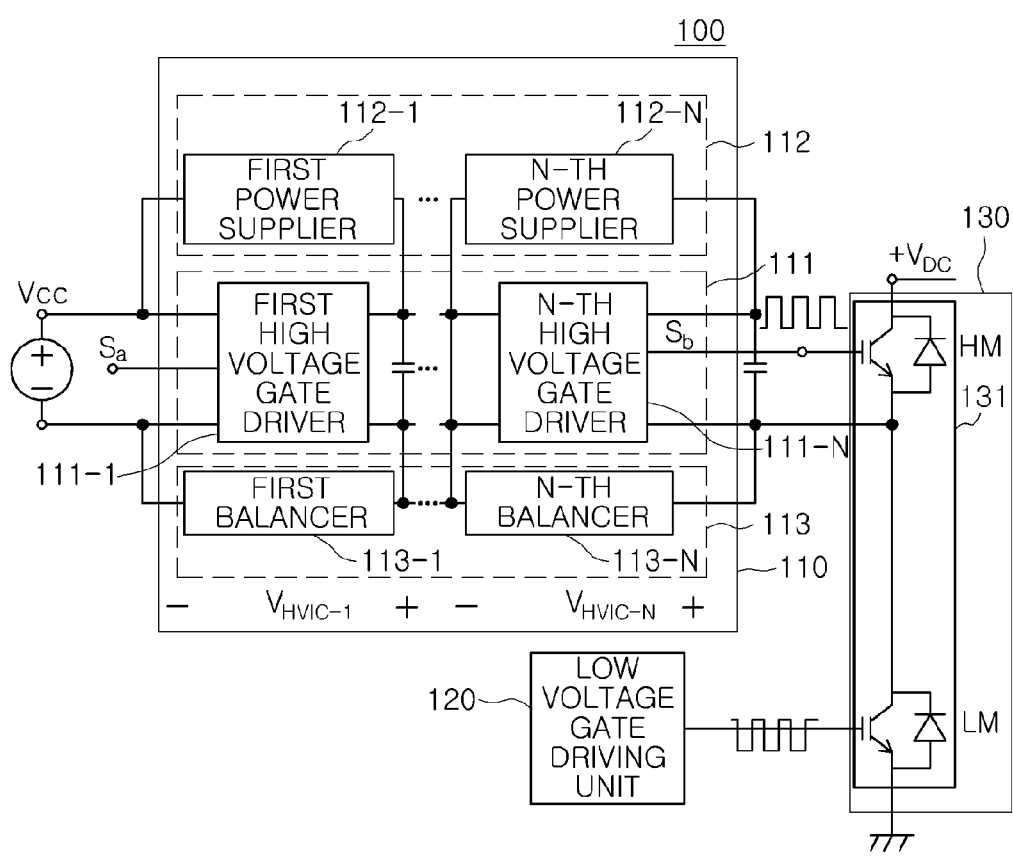
FIGS. 1 through 8 are circuit diagrams schematically showing an inverter according to first to seventh embodiments of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

It will be understood that when an element is referred to as being "connected to" another element, it can be directly connected to the other element or may be indirectly connected to the other element with element(s) interposed therebetween. Unless explicitly described to the contrary, the word "comprise" and variations such as "comprises" or "comprising," will be understood to imply the inclusion of stated elements but not the exclusion of any other elements.

Throughout the drawings, the same or like reference numerals will be used to designate the same or like elements.

FIGS. 1 through 8 are circuit diagrams schematically showing an inverter according to first to seventh embodiments of the present invention.

Referring to FIG. 1, according to a first embodiment of the present invention, an inverter 100 may include a high voltage gate driving circuit unit 110, a low voltage gate driving unit 120, and an inverter unit 130.

The high voltage gate driving circuit 110 may include a high voltage gate driving unit 111, a power supplying unit 112, and a voltage-dividing unit 113.

The high voltage gate driving unit 111 may include a plurality of high voltage gate drivers 111-1 to 111-N. As illustrated in FIG. 1, first to N-th high voltage gate drivers 111-1 to 111-N may be serially connected between an instruction signal input terminal to which an instruction signal Sa requesting a switching control of the inverter unit 130 is input and a control signal output terminal from which a control signal Sb controlling a switching of the inverter unit 130 is output. The high voltage gate driving unit 111 may control the switching of the inverter unit 130. Therefore, when the instruction signal Sa is input to the first high voltage gate driver 111-1, information about the switching control included in the instruction signal Sa is transferred to a high voltage gate driver of a rear stage and an N-th high voltage gate driver 111-N of the last stage transfers the control signal Sb corresponding to an intention of the switching control requested by the instruction signal Sa input to the first high voltage gate driver 111-1 to the inverter unit 130, whereby the switching of the inverter unit 130 may be controlled.

The inverter unit 130 may switch input power VDC to output AC power and may include at least one inverter arm 131 having at least one high side switch HM and at least one low side switch LM connected to each other in series between an input power terminal to which the input power VDC is input and a ground. Although not shown, in order to share the applied voltage, a plurality high side switches may be connected to each other in series and similarly a plurality of low side switches may be connected to each other in series.

A gate of the high side switch HM may receive the control signal Sb from the high voltage gate driving unit 111 to thereby control the switching on and switching off and a gate of the low side switch LM may also receive the control signal from the low voltage gate driving unit 120 to thereby control the switching on and switching off, and power having a voltage level corresponding to the input power VDC may be applied to the high voltage gate driving unit 110 according to the switching on and switching off of the high side switch HM.

The high voltage gate driving circuit unit 110 may include the voltage-dividing unit 113 so that the voltage level of the applied power may be divided and applied to the first to N-th high voltage gate drivers 111-1 to 111-N.

The voltage-dividing unit 113 may include first to N-th balancers 113-1 to 113-N, and the first to N-th balancers 113-1 to 113-N may correspond to the first to N-th high voltage gate drivers 111-1 to 111-N in a one-to-one scheme to thereby be connected to the corresponding high voltage gate drivers in parallel. Therefore, the first to N-th balancers 113-1 to 113-N may equally divide the voltage level of the power applied to the first to N-th high voltage gate drivers 111-1 to 111-N according to the switching on and switching off of the high side switch HM. Therefore, for example, the input power VDC having a voltage level of 1200V or more is input and the voltage level of the applied power is equally divided according to the switching on and switching off of the high side switch HM. As in the case of an inverter 300 according to a third embodiment of the present invention illustrated in FIG. 3, two high voltage gate drivers 311-1 and 311-2 each having a withstand-voltage of 600V are connected to each other in series, or although not illustrated, three high voltage gate drivers each having a withstand-voltage of 400V are connected to each other in series. In this manner, such configuration may replace a relatively expensive high voltage gate driver of 1200V, whereby manufacturing costs may be decreased.

Figure 3:
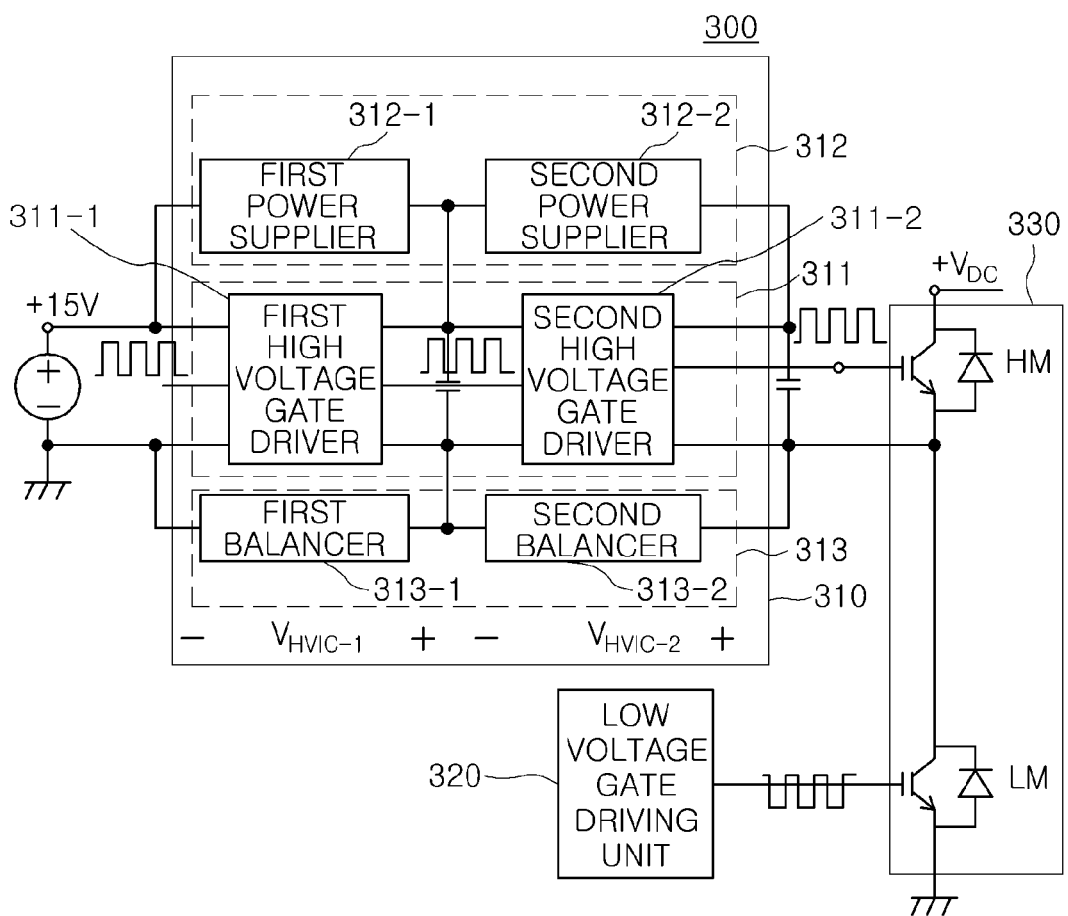

In the case of the inverter 300 according to the third embodiment of the present invention illustrated in FIG. 3, a voltage-dividing unit 313 may include first and second balancers 313-1 and 313-2 corresponding to the first and second high voltage gate drivers 311-1 and 311-2. As in the case of inverters 600, 700, and 800 according to sixth to eighth embodiments of the present invention illustrated in FIGS. 6 through 8, the first and second balancers 313-1 and 313-2 may include at least one of resistors R1 and R2 connected to each other in series and connected to first and second high voltage gate drivers 611-1, 611-2, 711-1, 711-2, 811-1, and 811-2 in parallel or may include at least one of resistors R1 and R2 and at least one of diodes D1 and D2 connected to the at least one of resistors R1 and R2 in parallel.

The high voltage gate driving unit 111 may have a single power Vcc applied thereto.

In order to apply the single power Vcc to the first to N-th high voltage gate drivers 111-1 to 111-N, respectively, the high voltage driving circuit 110 may further include the power supplying unit 112.

The power supplying unit 112 may include a plurality of power suppliers 112-1 to 112-N, and the plurality of power suppliers 112-1 to 112-N may transfer a single power Vcc to the first to N-th high voltage gate drivers 111-1 to 111-N, respectively, to thereby stably supply necessary power to the first to N-th high voltage gate drivers 111-1 to 111-N and have a simple circuit configuration compared with a circuit supplying independent driving powers to the first to N-th high voltage gate drivers 111-1 to 111-N, respectively, whereby manufacturing costs may be further decreased.

Figure 4:
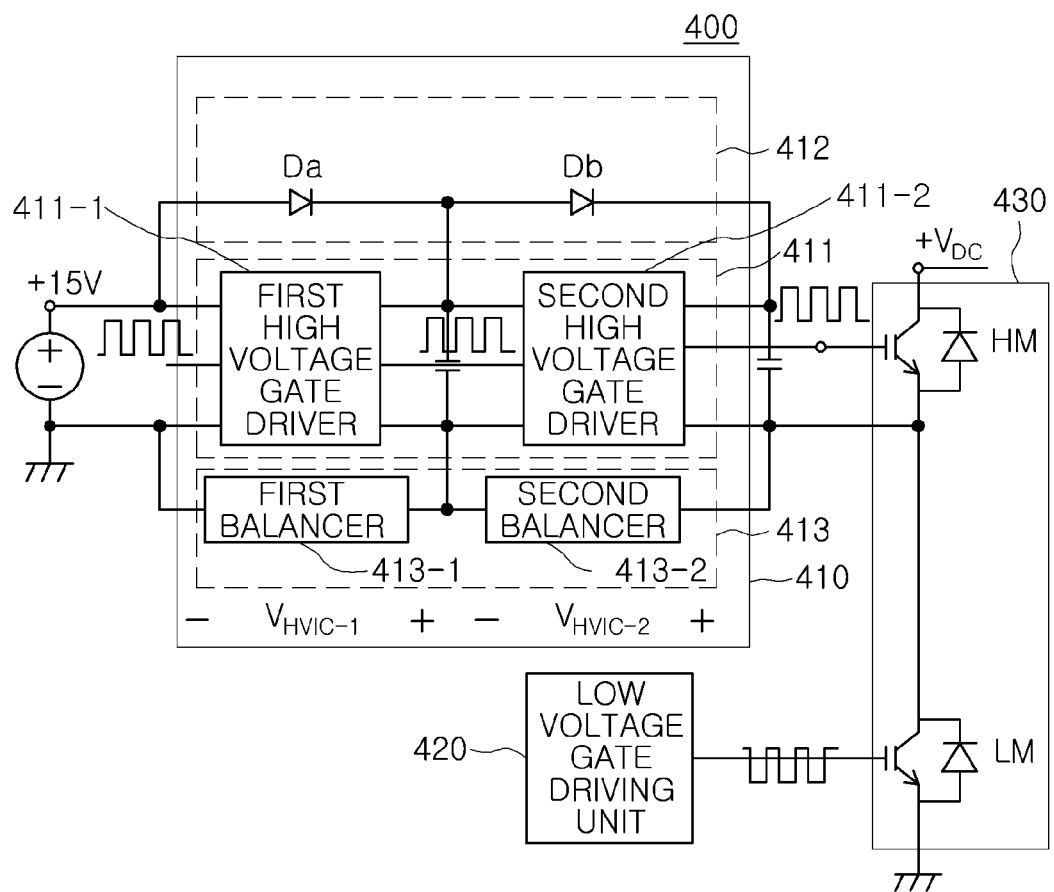
Figure 5:
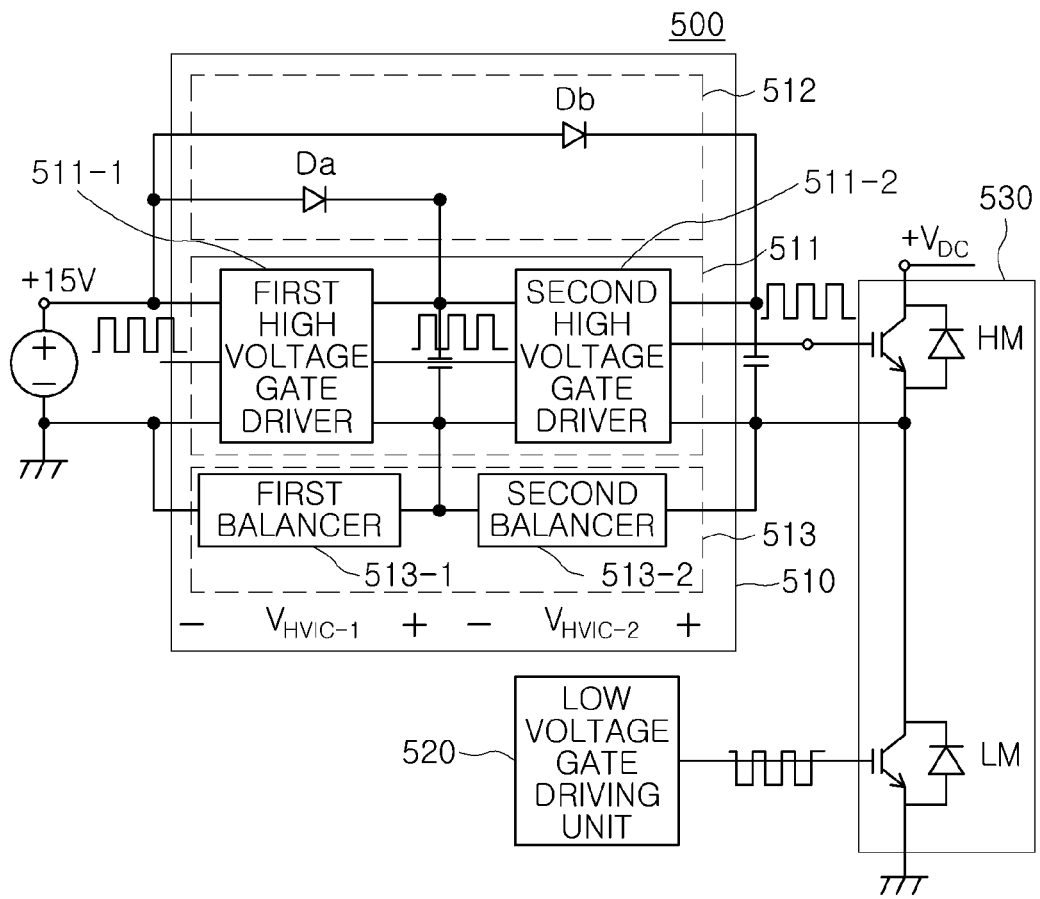
Figure 6:
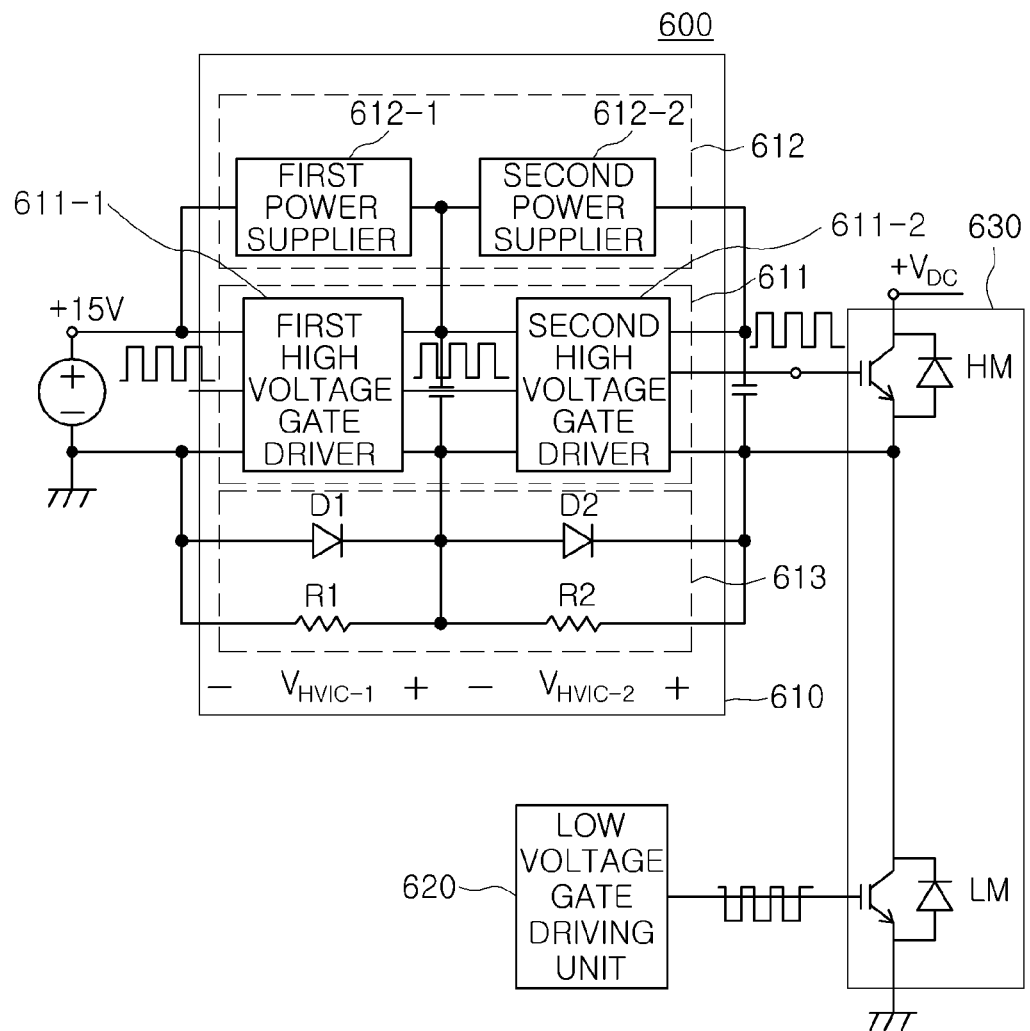
Figure 7:
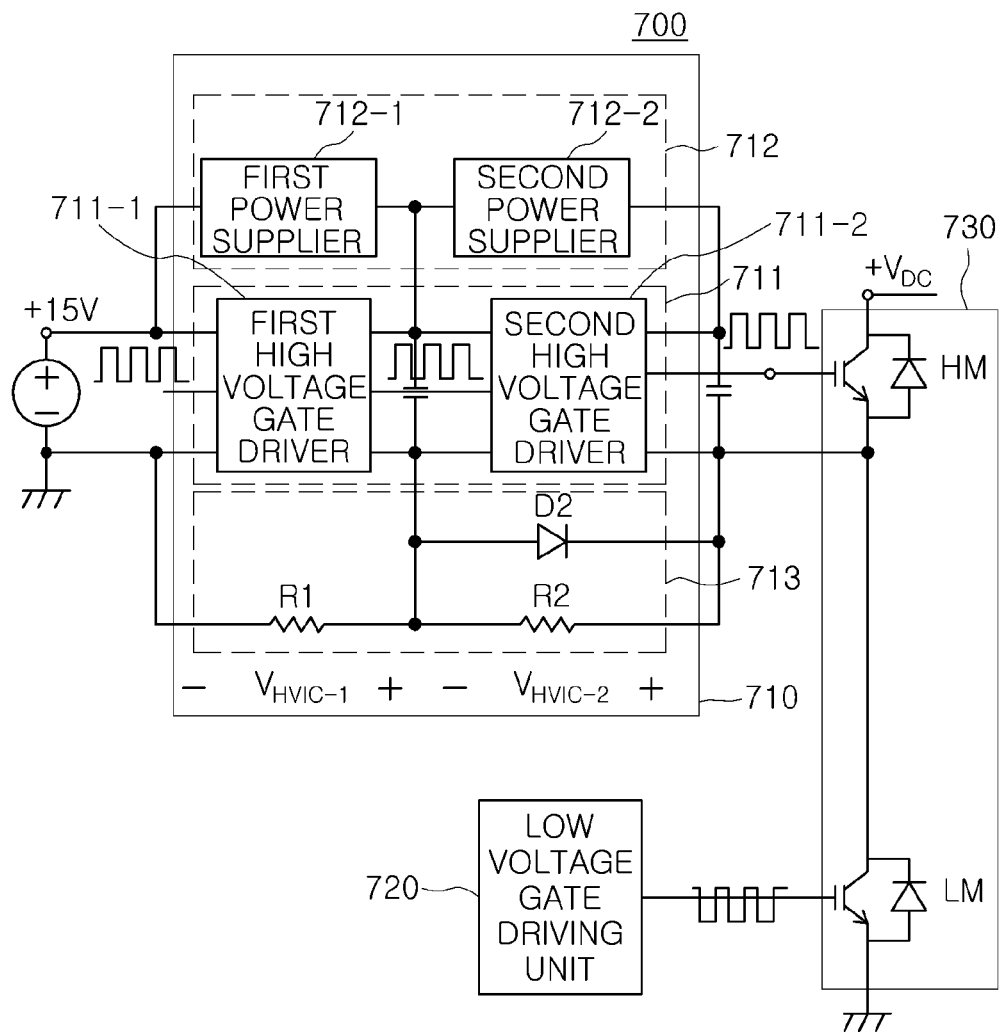
Figure 8:
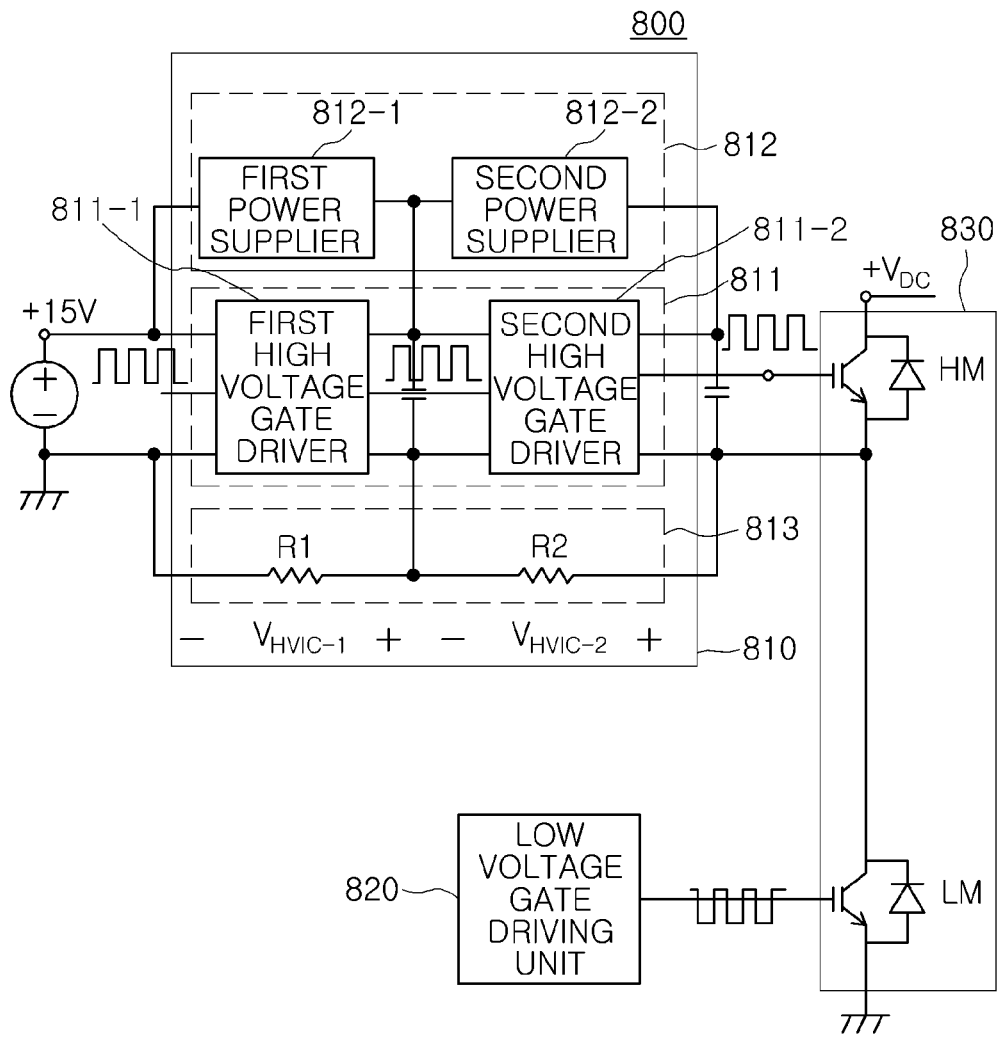

In the case of the inverter 300 according to the third embodiment of the present invention illustrated in FIG. 3, the inverter 300 may include first and second power suppliers 312-1 and 312-2 corresponding to the first and second high voltage gate drivers 311-1 and 311-2, and as in the case of inverters 400 and 500 according to fourth and fifth embodiments of the present invention illustrated in FIGS. 4 and 5, the first and second power suppliers 312-1 and 312-2 may include diodes Da and Db, and the diodes Da and Db may be connected to each other in series and connected to first and second high voltage gate drivers 411-1 and 411-2 in parallel, respectively, or the diodes Da and Db may be connected to each other in parallel and connected to first and second high voltage gate drivers 511-1 and 511-2 in parallel, respectively.

Figure 2:
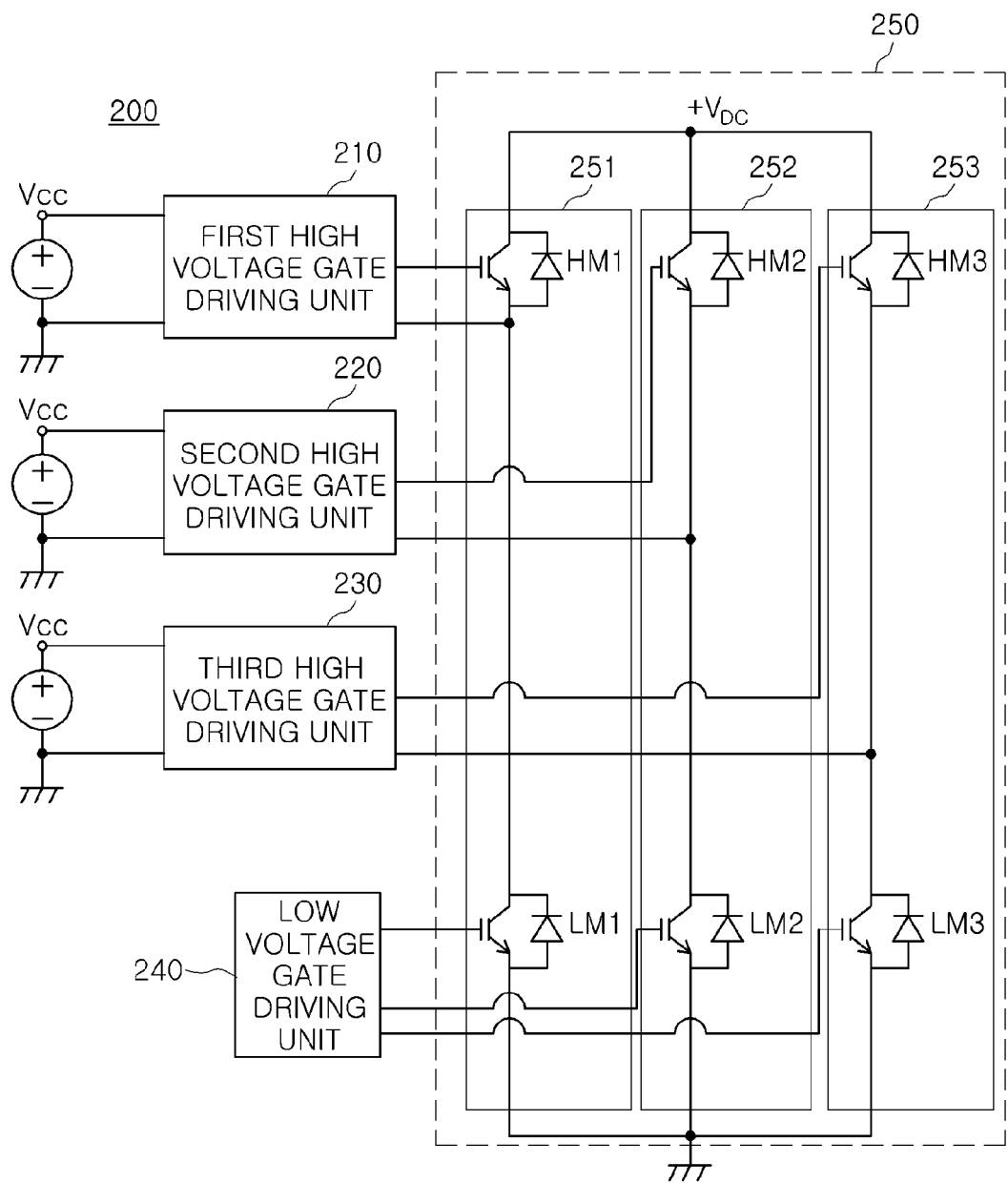

Meanwhile, as described above, the inverter unit 130 may include at least one inverter arm 131. In the case in which the output AC power is single phase, the inverter unit 130 may include one inverter arm 131. As illustrated in FIG. 2, in the case in which the output AC power is three phases, an inverter unit 250 may include three inverter arms 251, 252, and 253. Therefore, an inverter 200 according to a second embodiment of the present invention illustrated in FIG. 2 may include first, second, and third high voltage gate driving circuit units 210, 220, and 230 controlling the switching on and switching off of high side switches HM1, HM2, and HM3 of the three inverter arms 251, 252, and 253. The switching on and switching off of low side switches LM1, LM2, and LM3 may be controlled by a low voltage gate driving unit 240. Here, since the configurations of the first to third high voltage gate driving circuit units 210, 220, and 230 are the same as the configuration of the high voltage gate driving circuit unit 110 illustrated in FIG. 1, the detailed description thereof will be omitted.

Figure 9:
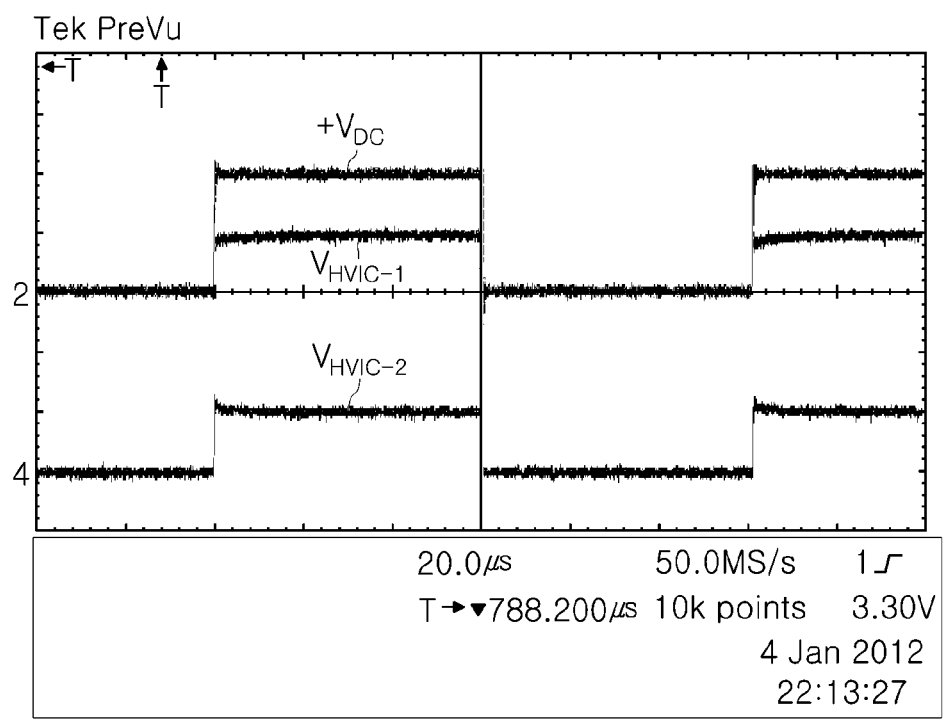
FIG. 9 is a voltage waveform diagram showing electrical characteristics of the inverter according to the embodiment of the present invention.

FIG. 9 is a voltage waveform diagram showing electrical characteristics of the inverter according to the embodiment of the present invention.

As illustrated in FIG. 9, it may be appreciated that in the case in which input power VDC is 1200V based on the inverter 300 according to the third embodiment of the present invention illustrated in FIG. 3, the voltage level of power applied according to the switching on and switching off of the high side switch HM may be equally divided by 600V and applied to the high voltage gate drivers 311-1 and 311-2, respectively, to thereby employ the high voltage gate drivers each having a withstand-voltage of 600V in the inverter having the input power of 1200V.

As set forth above, according to the embodiments of the present invention, in the case of switching the input power of approximately 1200V, a plurality of driving circuits having the withstand-voltage characteristics lower than 1200V are connected to each other in series and the voltage applied to the plurality of driving circuits at the time of switching is divided to allow the driving circuits to be stably operated, such that a relatively expensive driving circuit having a withstand-voltage of 1200V may be replaced by the driving circuits, whereby manufacturing costs may be decreased. In addition, a single power is supplied to the plurality of driving circuits, whereby the circuit configuration may be simplified and the manufacturing costs may be further decreased.

While the present invention has been shown and described in connection with the embodiments, it will be apparent to those skilled in the art that modifications and variations can be made without departing from the spirit and scope of the invention as defined by the appended claims.

What is claimed is:

1. A gate driving circuit comprising:
   a high voltage gate driving circuit unit including at least one high voltage gate driving unit having a plurality of high voltage gate drivers connected to each other in series between an input terminal receiving an instruction signal serving as a switching control for controlling an inverter unit and an output terminal outputting a control signal for controlling switching of the inverter unit,
   the inverter unit including at least one inverter arm having at least two switches and switching input power to output alternating current (AC) power, and
   the high voltage gate driving circuit unit controlling switching of a high side switch of the at least two switches, dividing voltage generated at an output of the high side switch at the time of the switching of the high side switch, and applying the divided voltage to the plurality of high voltage gate drivers.

2. The gate driving circuit of claim 1, wherein the high voltage gate driving circuit unit includes a voltage-dividing unit dividing the voltage generated at the time of the switching of the high side switch and applied to the plurality of high voltage gate drivers, respectively.

3. The gate driving circuit of claim 2, wherein the voltage-dividing unit includes a plurality of balancers connected to the plurality of high voltage gate drivers in parallel, respectively, and equally dividing the voltage applied to the plurality of high voltage gate drivers, respectively.

4. The gate driving circuit of claim 3, wherein at least one balancer among the plurality of balancers includes at least one resistor connected to a corresponding high voltage gate driver in parallel.

5. The gate driving circuit of claim 4, wherein the at least one balancer among the plurality of balancers further includes at least one diode connected to the at least one resistor in parallel.

6. The gate driving circuit of claim 1, wherein the inverter unit is supplied with a single driving power.

7. The gate driving circuit of claim 6, wherein the at least one high voltage gate driving unit further includes a power supplying unit having a plurality of power suppliers transferring the single driving power to the plurality of high voltage gate drivers, respectively.

8. The gate driving circuit of claim 7, wherein the plurality of power suppliers include at least one or more diodes connected to each other in series.

9. The gate driving circuit of claim 8, wherein the plurality of power suppliers include at least one or more diodes connected to each other in parallel.

10. The gate driving circuit of claim 1, further comprising a low voltage gate driving unit controlling switching of a low side switch of the at least two switches.

11. The gate driving circuit of claim 1, wherein the inverter unit includes three inverter arms connected to each other in parallel.

12. The gate driving circuit of claim 11, further comprising first to third high voltage gate driving circuit units driving respective high side switches of the three inverter arms.

13. An inverter, comprising:
an inverter unit including at least one inverter arm having at least one high side switch and at least one low side switch connected to each other in series between a ground and an input power terminal providing input power having a preset voltage level, and switching the input power to output AC power; and
a high voltage gate driving circuit unit including at least one high voltage gate driving unit having a plurality of high voltage gate drivers connected in series between an input terminal receiving an instruction signal serving as a switching control for controlling the inverter unit and an output terminal outputting a control signal for controlling switching of the inverter unit, such that switching of the at least one high side switch is controlled, and voltage generated at an output of the at least one high side switch at the time of the switching of the at least one high side switch is divided and applied to the plurality of high voltage gate drivers.

14. The inverter of claim 13, wherein the high voltage gate driving circuit unit includes a voltage-dividing unit dividing the voltage generated at the time of the switching of the at least one high side switch and applied to the plurality of high voltage gate drivers, respectively.

15. The inverter of claim 14, wherein the voltage-dividing unit includes a plurality of balancers connected to the plurality of high voltage gate drivers in parallel, respectively, and equally dividing the voltage applied to the plurality of high voltage gate drivers, respectively.

16. The inverter of claim 15, wherein at least one balancer among the plurality of balancers includes at least one resistor connected to a corresponding high voltage gate driver in parallel.

17. The inverter of claim 16, wherein the at least one balancer among the plurality of balancers further includes at least one diode connected to the at least one resistor in parallel.

18. The inverter of claim 13, wherein the inverter unit is supplied with a single driving power.

19. The inverter of claim 18, wherein the at least one high voltage gate driving unit further includes a power supplying unit having a plurality of power suppliers transferring the single driving power to the plurality of high voltage gate drivers, respectively.

20. The inverter of claim 19, wherein the plurality of power suppliers include at least one or more diodes connected to each other in series.

21. The inverter of claim 19, wherein the plurality of power suppliers include at least one or more diodes connected to each other in parallel.

22. The inverter of claim 13, further comprising a low voltage gate driving unit controlling switching of the at least one low side switch.

23. The inverter of claim 13, wherein the inverter unit includes three inverter arms connected to each other in parallel.

24. The inverter of claim 23, further comprising first to third high voltage gate driving circuit units driving respective high side switches of the three inverter arms.

* * * * *